United States Patent [19]

Shiga

[11] 4,134,150
[45] Jan. 9, 1979

[54] RANDOM ACCESS MONOSTABLE MEMORY CELL HAVING BOTH STATIC AND DYNAMIC OPERATING MODES

[75] Inventor: Kazumasa Shiga, Kawasaki, Japan

[73] Assignee: Matsushita Electric Industrial Co., Ltd., Osaka, Japan

[21] Appl. No.: 714,999

[22] Filed: Aug. 17, 1976

[30] Foreign Application Priority Data

Jul. 20, 1976 [JP] Japan .................................. 51-86729

[51] Int. Cl.$^2$ ........................ G11C 7/00; G11C 11/40
[52] U.S. Cl. .................................... 365/222; 365/154
[58] Field of Search ................ 340/173 FF, 173 CA; 307/279, 291, 238; 365/149, 150, 154, 156, 188, 222

[56] References Cited

U.S. PATENT DOCUMENTS

| | | | |
|---|---|---|---|
| 3,618,053 | 11/1971 | Hudson et al. ...................... | 307/279 |
| 3,644,907 | 2/1972 | Gricchi et al. ................ | 340/173 FF |
| 3,858,185 | 12/1974 | Reed ............................ | 340/173 DR |
| 3,968,479 | 7/1976 | Goser ........................... | 340/173 FF |
| 3,997,881 | 12/1976 | Hoffman ....................... | 340/137 FF |

Primary Examiner—Bernard Konick
Assistant Examiner—Donald McElheny
Attorney, Agent, or Firm—Lowe, King, Price & Becker

[57] ABSTRACT

Memory cells in a random access memory system are addressed through associated X and Y address lines. Each memory cell is operable as a static memory device to represent "1" binary data in response to a first control potential applied to the associated X address line and a first data input potential applied to the associated Y address line and further operable as a nonstatic memory device to represent "0" binary data in response to the first control potential applied to the X address line and to a second data input potential applied to the Y address line. Means are provided to refresh the stored "0" binary data by simultaneously applying a second control potential lower than the first control potential to all of the X address lines at periodic intervals and simultaneously therewith applying the second data input potential to all of the Y address lines.

23 Claims, 9 Drawing Figures

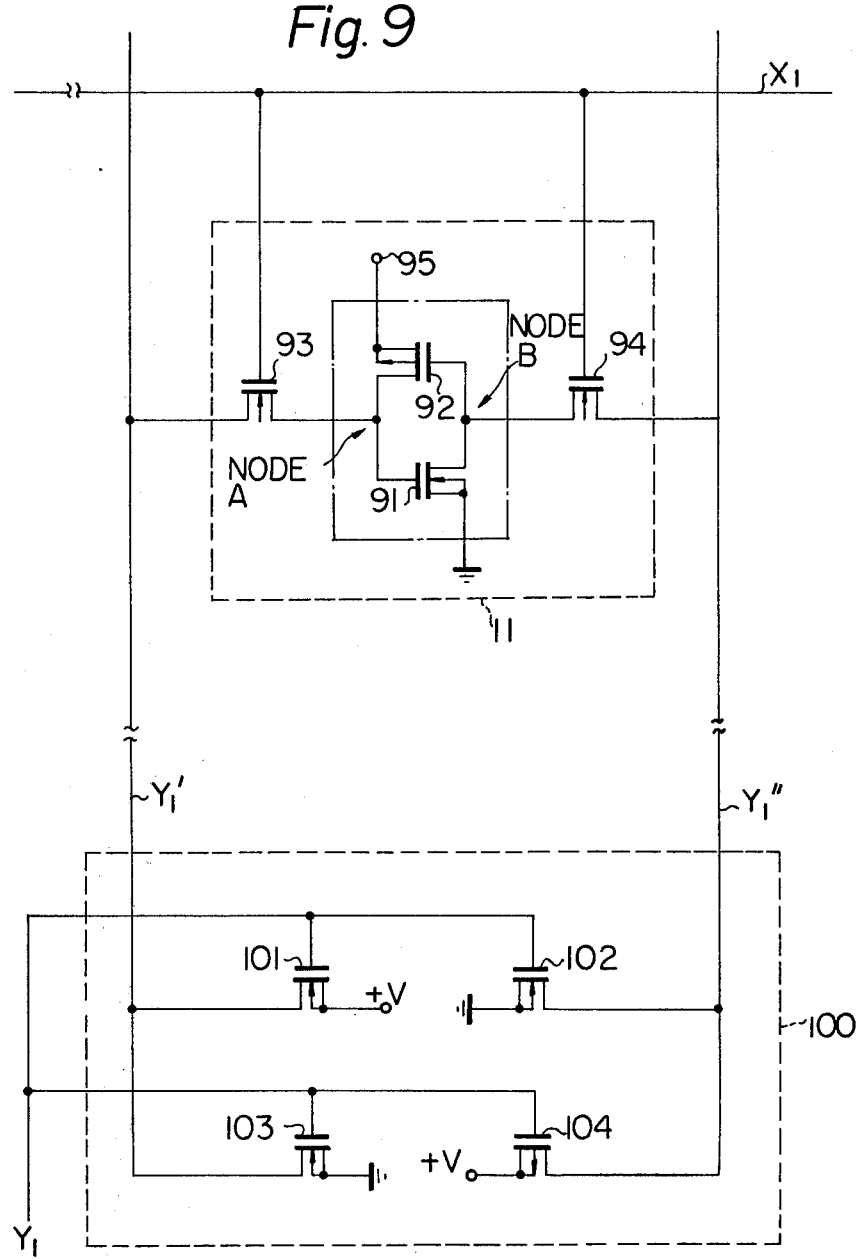

RANDOM ACCESS MONOSTABLE MEMORY CELL HAVING BOTH STATIC AND DYNAMIC OPERATING MODES

FIELD OF THE INVENTION

The present invention relates to random access memories and relates particularly to a memory cell and a system for operating the cell to store binary data in static and dynamic modes.

Random access memories utilizing bistable memory cells to store information are known in the art as static memories. These bistable memory cells each comprise a pair of identical inverters having their input and output terminals so cross-coupled in a flip-flop configuration that the input terminal of each inverter is coupled to the output terminal of the other inverter. However, such bistable flip-flop configuration requires a comparatively large number of components per unit area on a semiconductor chip.

On the other hand, random access memories utilizing incremental charges to store information in an array of memory cells are also known in the art as dynamic memory systems. However, because of the volatile nature of the stored information, the information-carrying charge is periodically refreshed, and as a result a complex circuitry is required to address the stored information to be refreshed.

The primary object of the invention is to provide a memory cell which combines the advantages of the static and dynamic memory systems and provide a system for operating the cells in the static and dynamic states to represent binary states.

Another object of the invention is to achieve minimum number of circuit components to increase the density of circuit integration on a semiconductor chip.

A further object of the invention is to provide a memory cell and a system in which all of the cells in the memory are indescriminately refreshed eliminating the need to identify the location of the memory cells as required in the prior art dynamic memory system.

Briefly stated, in accordance with a first aspect of the invention the memory cell comprises a pair of first and second transistors each having a control electrode and first and second controlled electrodes or terminals so cross-coupled that the control electrode of each transistor is connected to the first controlled terminal of the other transistor at first and second storage nodes, a third transistor having a control electrode connected to the corresponding one of a plurality of X address buses, a first controlled terminal connected to the corresponding one of a plurality of Y address buses, and a second controlled terminal connected to the first storage node, and a fourth transistor having its conducting path connected across the second storage node and a voltage source to serve as a load resistance. The second controlled terminal of the first and second transistors are respectively kept at such potentials that upon application of a first control potential to an addressed X address bus and a first data input potential to an addressed Y address bus the third transistor is switched on to couple the potential to the first storage node. Preferably, the first and second transistors are formed by a pair of MOSFETs of opposite conductivity types or a CMOS field-effect transistor. With the first node being at the first data input potential, one of the MOSFETs is rendered conductive which subsequently renders the other MOSFET conductive to form a memory loop which represents a first binary state. This state is a stable state and defined as "1" state. By application of a second data input potential to the Y address bus of the addressed memory cell the first and second transistors are turned off. In this condition, these transistors serve as capacitance devices to store information-carrying charges across the first and second storage nodes to represent a second binary state. The storage capability of these transistors is utilized to represent a second binary state. This state is an unstable state and defined as "0" state. To counteract the tendency of the information-carrying charge to dissipate its energy, all of the X address buses are periodically biased at such a potential that the third transistor of all cells becomes partially conductive. At the same time all of the Y address buses are biased at the second data input potential.

In this condition, the transfer conductance of the third transistor is relatively high provided that both potentials at the Y address bus and the first storage node are approximately at the second data input potential in the case of the "0" state memory cell. Because the leakage current through the off-state transistors is extremely small, "0" state in the cell is retained by the third transistor. In the case of "1" state memory cells, the transfer conductance of the third transistor is very low due to its saturation characteristic and the effect of back-gate or reverse bias when the first storage node is at the first data input potential. Because the current through the third transistor is smaller than that through the on-state transistor, "1" state in the cell is not disturbed during the refreshment period. Therefore, the refreshment for the "0" state memory cells can be automatically and self-selectively achieved.

In accordance with a second aspect of the invention, the memory cell comprises a first or symmetrical inverter having the characteristic of storage decay and a second or asymmetrical inverter having the characteristic of storage decay and responsive only to a particular potential level at the output of the first inverter. The first and second inverters are connected such that the input terminal of each inverter is connected to the output terminal of the other inverter. The input of the first inverter is connected to the corresponding Y address bus through a variable resistance switching gate whose control gate is connected to the corresponding X address bus. A "1" is stored on the memory cell by application of a first control potential to the addressed X and bus and a first data input potential to the addressed Y address bus so that the input terminal of the first inverter is biased at the first data input potential which is inverted to a second potential by the first inverter. The second inverter reverses the second data input potential to the first potential and applies it to the input terminal of the first inverter so that a closed memory loop is formed to represent a first binary state. This state is a stable state and defined as "1" state. By the application of a second data input potential to an addressed Y address bus, this potential is inverted to a first data input potential by the first inverter. There occurs no reversal of the potential in the second inverter because of its asymmetrical characteristic so that charges are stored across the input and output terminals of the first and second inverters to represent a data second binary state. This state is unstable and defined as "0" state. The same refreshment is accomplished in a manner identical to that described above.

These and other objects, features and advantages of the present invention will be understood from the following description taken in conjunction with the accompanying drawings, in which:

FIG. 9 is a further modification of the first embodiment of FIG. 3.

Figure 1:
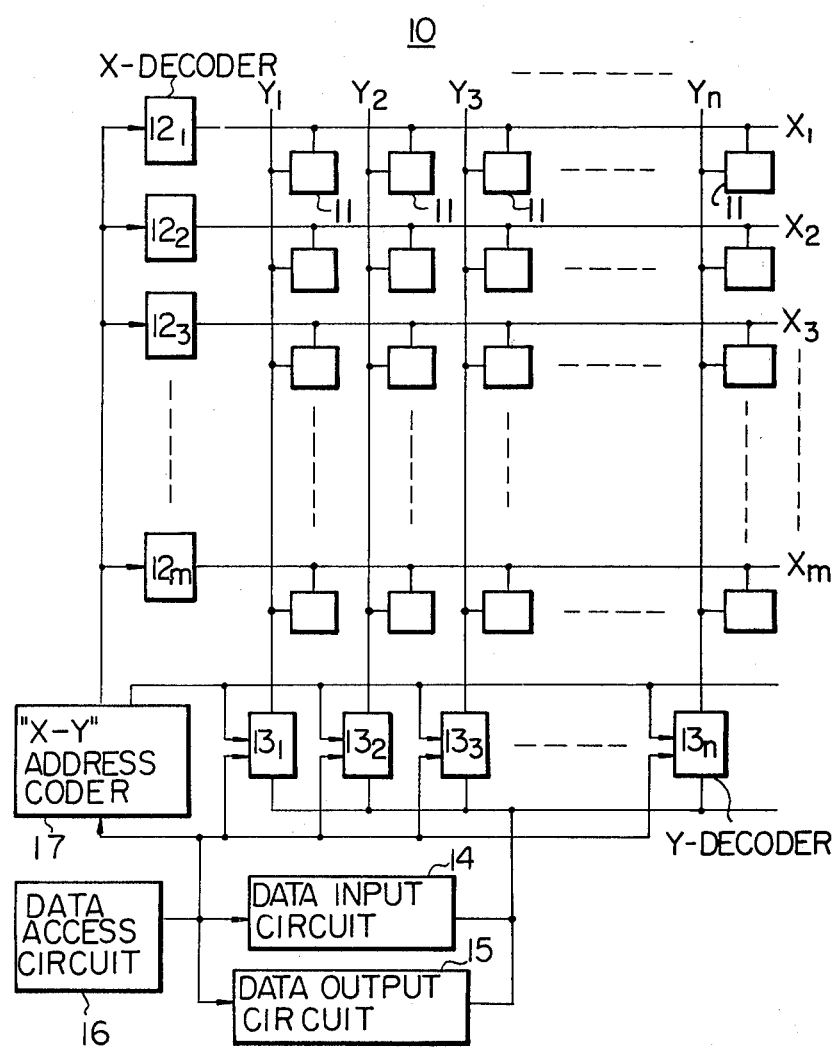
FIG. 1 is a block diagram of a portion of a memory array embodying the present invention.

Referring now to FIG. 1 of the drawings, there is illustrated a block diagram of a portion of an overall arrangement of a random access memory generally indicated by the numeral 10 embodying the principles of the present invention. The memory 10 includes a plurality of memory cells 11 arranged in an array of rows and columns. The memory cells 11 within each row are coupled together by an X address bus, for example, X address bus $X_1$ and those within each column are coupled together by a Y address bus, for example, Y address bus $Y_1$. Each row is identified by a specific one of a plurality of X address decoders $12_1$ to $12_m$. Likewise, each column is identified by a specific one of a plurality of Y address decoders $13_1$ to $13_n$.

The memory cells 11 within each column are coupled together by a read/write or data bus, for example, data bus $Y_1$ which is coupled to the Y address decoder $13_1$ and thence to a data input or write circuit 14 and a data output or read circuit 15.

A data access and control circuit 16 is provided to generate instructions and timing signals to an X-Y address coder 17 which in turn generates X address codes to the X address decoders $12_1$ to $12_m$ and Y address codes to the Y address decoders $13_1$ to $13_n$. The X and Y address codes are received and decoded by the X and Y address decoders to address a specific one of the X address buses $X_1$ to $X_m$ and a specific one of the Y address buses $Y_1$ to $Y_n$.

The data access and control circuit 16 is also coupled to the data input circuit 14 and data output circuit 15 to instruct the latter to receive data signal from the addressed memory cell 11.

Figure 2:
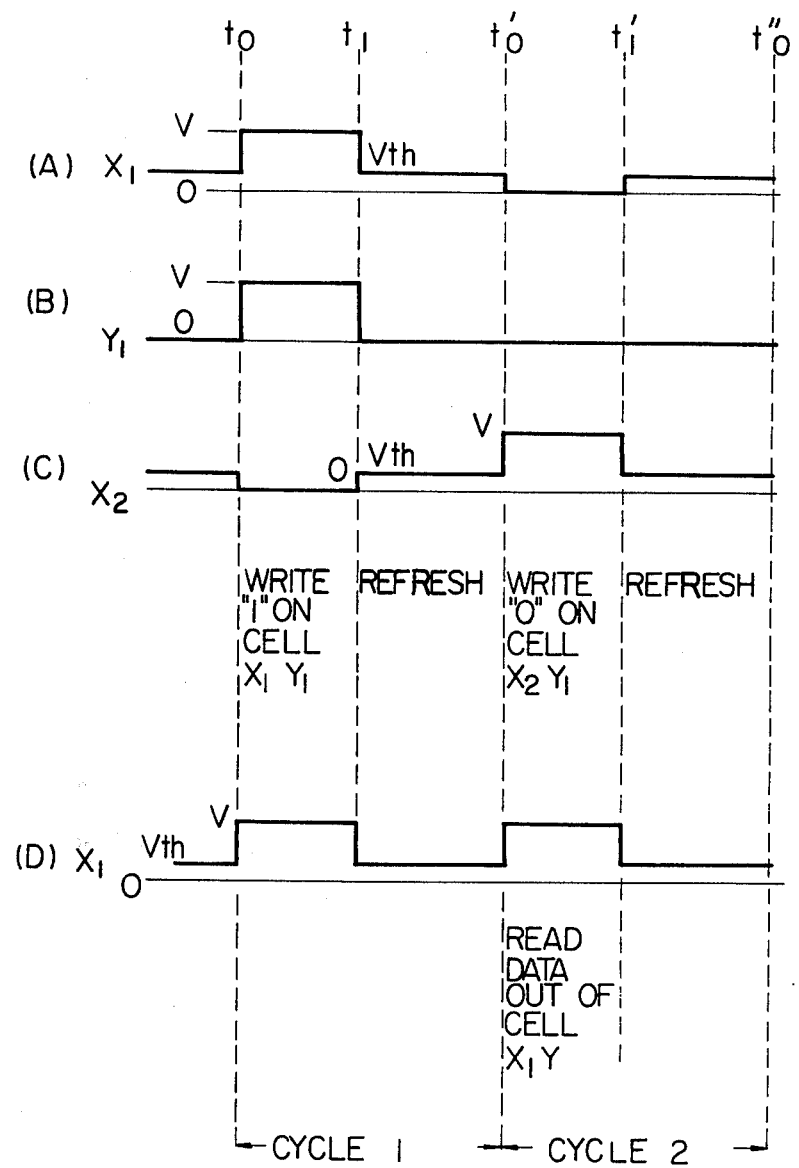
FIG. 2 is a graphical representing of the waveforms appearing at various points in the diagram of FIG. 1.

Referring to FIG. 2, there is shown a series of typical waveforms appearing at various points in FIG. 1. FIG. 2 represents two cycles in the operation of the random access memory 10 of FIG. 1. The first cycle includes the time interval from $t_0$ to $t_0'$ and the second cycle include the interval from $t_0'$ to $t_0''$. During these two cycles, only the exemplary X address buses $X_1$ and $X_2$ are addressed. A complete working cycle of the memory 10 would require numerous additional cycles of the X address buses. However, two cycles involving only the X address buses $X_1$ and $X_2$ are sufficient to illustrate the operation of the memory 10.

Referring to FIG. 2A, in a first working cycle it is assumed that the X address bus $X_1$ has been addressed by the X address decoder $12_1$ during the time interval $t_0$ to $t_1'$ and a +V potential is applied to the addressed $X_1$ bus, while all of the nonaddressed X buses are clamped at ground potential (FIG. 2c). If it is desired to write a "1" on the memory cell 11 associated with the buses $X_1$ and $Y_1$, a +V potential or first data input potential is applied to the Y address bus $Y_1$ and a +V potential or first control potential is applied to the addressed bus $X_1$, as shown in FIGS. 2A and 2B. During the time interval $t_1$ to $t_0'$, all of the X address buses $X_1$ to $X_m$ are at a potential of $+V_{th}$ or second control potential to refresh those memory cells storing "0". During the time interval $t_0'$ to $t_1'$ of a second working cycle, the X address bus $X_2$ is assumed to have been addressed. A +V potential is applied to the address bus $X_2$ and ground potential to the rest of the X address buses including the address bus $X_1$ (FIG. 2A). If it is desired to write a "0" on the memory cell 11 associated with the buses $X_2$ and $Y_1$, the Y address bus $Y_1$ is biased at ground potential or second data input potential (FIG. 2B). During the time interval $t_1'$ to $t_0''$, all of the X address buses are brought to the potential of $+V_{th}$ volts to simultaneously refresh the data "0" stored on the memory cells 11 including the cell associated with the crosspoint $X_2$, $Y_1$. The operation of the memory cell 11 and the refreshment of the memory cells storing "0" will be described later.

Referring to FIG. 2D, if it is desired to read information out of the memory cell 11 at the crosspoint $X_1$ and $Y_1$ during interval $t_0'$ to $t_1'$ of the second cycle, a first data input potential of +V volts is applied to the X address bus $X_1$ and a read signal is applied from data access and control circuit 16 to the Y address decoder $13_1$. The decoder $13_1$ then senses the potential at the $Y_1$ address bus. Subsequent to the reading of the information out of the memory cell 11, refreshment of the memory cells storing a "0" is accomplished during the time interval $t_1'$ to $t_0''$.

Figure 3:
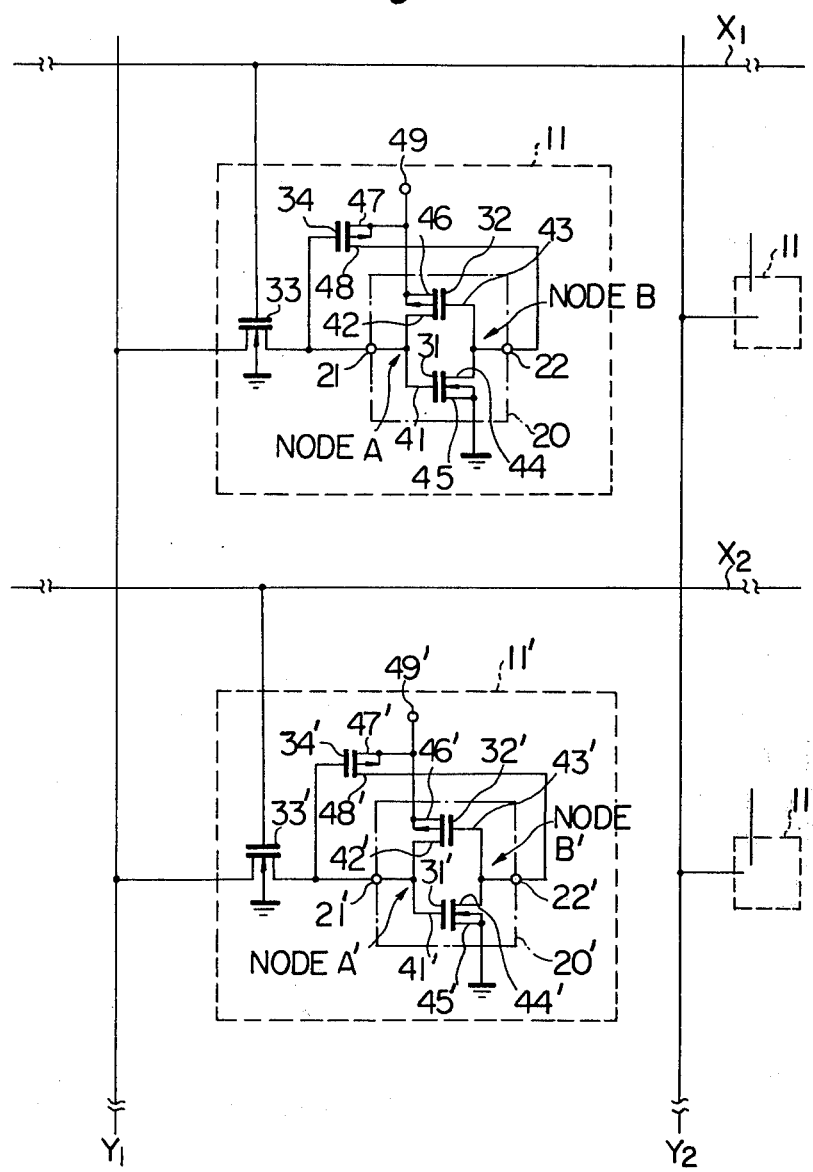
FIG. 3 is a detailed circuit diagram of exemplary memory cells associated with address buses $X_1$ and $Y_1$ and address buses $X_2$ and $Y_1$.

Referring now to FIG. 3 there is shown a detailed circuit of the memory cell 11 which is associated with the address buses $X_1$ and $Y_1$. In accordance with a first aspect of the invention, the memory cell 11 comprises a monostable device which is shown in a chain-dot line rectangle 20 and provided with input and output terminals 21 and 22, respectively. The monostable device 20 includes a first transistor or n-channel enhancement type MOS field-effect transistor 31, a second or p-channel MOSFET 32, a third or n-channel MOSFET 33 and a fourth or p-channel MOSFET 34. The first transistor 31 has a gate or control electrode 41 which is cross-coupled to a first controlled electrode 42 of the second transistor 32 and is also coupled to the input terminal 21 of the monostable device 2o at node A. Similarly, the second transistor 32 has a gate or control electrode 43 which is cross-coupled to a first controlled electrode 44 of the first transistor 31 and is also coupled to the output terminal 22 of the monostable device 20 at node B. The second controlled electrode 45 of the first transistor 31 is coupled to ground and the second controlled electrode 46 of the second transistor 32 is coupled to a supply terminal 49 at a potential of +V volts.

The input terminal 21 of monostable device 20 is connected through the first and second electrodes of the third transistor 33 to the address bus $Y_1$ and is also connected to the control electrode of the fourth transistor 34. The fourth transistor 34 has a first controlled electrode 47 connected to the +V supply terminal 49 and a second controlled electrode 48 connected to the output terminal 22 of the monostable device 20.

The operation of the memory cell 11 will be described with reference to FIG. 2. During the time interval $t_0$ to $t_1$, the address buses $X_1$ and $Y_1$ are both at a potential of $+V$ volts. Application of a $+V$ potential to the address bus $X_1$ switches the third transistor 33 on. Similarly, all of the transistors in the memory cells 11 having their control gates connected to the address bus $X_1$ will be switched on. However, only the turn-on of the third transistor 33 of the memory cell 11 at the crosspoint $X_1$, $Y_1$ applies the $+V$ potential or first data input potential on the address bus $Y_1$ to the node A. N-channel first transistor 31 is switched on to couple ground potential to the control gate of the p-channel second transistor 32 to turn it on to conduct the $+V$ potential from source 49 to the control electrode 41 of the first transistor 31. The storage node A is therfore held at a voltage $+V$ or first data input potential. This state is a stable state and defined as "1" state.

During the time interval $t_0'$ to $t_1'$, a "0" is stored on the memory cell 11' associated with the crosspoint $X_2$, $Y_1$ regardless of its previous state by application of a ground or second data input potential to the address bus $Y_1$ and an address or first control potential ($+V$ volts) to the address bus $X_2$. The third transistor 33' is switched on to clamp the node A' to the ground potential so that the n-channel first transistor 31' is switched off. At the same time the p-channel fourth transistor 34 is switched on to connect the $+V$ potential form source 49' to the node B' and the p-channel second transistor 32' is also switched off. Under this condition, transistors 31', 32' and 34' serve as capacitors having the characteristic of storage decay over a decay period determined by the size of the transistors and the associated leakage current through the opposed electrodes. Because there is no active device in the cell to hold the storage node A' at the second data input potential, this state is not a stable state and is defined as "0" state.

Between successive read/write operations, those memory cells in the "0" state are refreshed. This is achieved by simultaneous application of a potential $+V_{th}$ or second control potential which is slightly above the threshold level of the third transistor 33 to all of the address buses $X_1$ to $X_m$ and by simultaneous application of ground or second data input potential to all of the Y address buses $Y_1$ to $Y_n$.

Under this condition, the transfer conductance of the transistor 33 of cell 11' is relatively high so that node A' is restored to the second data input potential (ground potential) and "0" state of the cell 11' is said to be refreshed. The transfer conductance of the third transistor 33 of cell 11 is the "1" state, on the contrary, is very low due to its saturation characteristic and the effect of reverse bias. Because the current through the transistor 33 is smaller than that through the on-state transistor 32, "1" state in the cell 11 is not disturbed during the refreshment period.

All of the "0" state memory cells, therefore, are refreshed self-selectively and automatically at the same time without disturbing the "1" state memory cell in every refreshment period.

Figure 4:
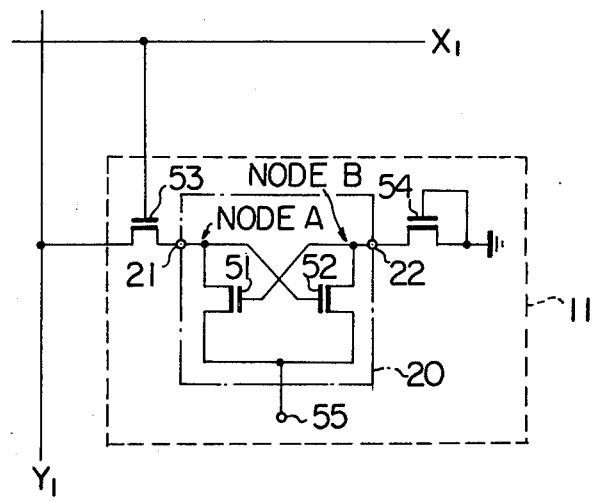
FIG. 4 is a modification of the embodiment of FIG. 3.

The memory cell constructed in accordance with the first aspect of the present invention can also be realized by the use of uni-channel MOS field-effect transistors as illustrated in FIG. 4 in which the monostable memory device 20 comprises a first p-channel MOSFET 51 and a second p-channel MOSFET 52 each having a control electrode and first and second controlled electrodes which are cross-coupled so that the control electrode of each transistor is coupled to the first electrode of the other transistor at nodes A and B and the second electrode of each transistor is coupled together to supply terminal at a potential of $+V$ volts. As in the previous embodiment, a third p-channel MOSFET 53 is provided having its control electrode connected to the address bus $X_1$ and the first controlled electrode connected to the address bus $Y_1$ and the second controlled electrode connected to the node A through input terminal 21 of the monostable device 20. The node B is coupled through output terminal 22 to a first controlled electrode of a fourth p-channel MOSFET 54 having its control electrode and the second controlled electrode connected together to ground.

A "1" is stored on the memory cell 11 by simultaneous application of a first control potential at $+V$ volts to the address bus $X_1$ and a first data input potential at $+V$ volts to address bus $Y_1$ to switch the third transistor 53 to the ON state to couple the $+V$ potential to the node A of monostable device 20. The second transistor 52 is switched off and the node B is lowered to ground potential or second data input potential which drives the first transistor 51 to the ON state to couple the first data input potential at $+V$ from terminal 55 to the node A. Therefore, nodes A and B are respectively biased at $+V$ and ground potentials which maintain transistor 51 in the ON state and transistor 52 in the OFF state even after the removal of the $+V$ potential from the address bus $Y_1$ to thereby store a ""1" in a static or stable mode.

When a "0" is stored on the memory cell 11 addressed by the address bus $X_1$, the application of ground potential to the address bus $Y_1$ causes the second transistor 52 to be switched on so that the potential at the node B is raised to $+V$ volts which drives the first transistor 51 to the OFF state. The memory cell 11 becomes unstable after the removal of the ground potential from the address bus $Y_1$ and this condition exists during the storage decay period determined by the storage capability of the first and second transistors. As previously described, refreshment of "0" state memory cells follows after the read/write operation, and during the refreshment period the third transistor 53 provides a variable transfer conductance path connection between the corresponding Y address bus and the node A of each memory cell depending upon the potential at the node A in a manner identical to that described in connection with previous embodiment.

It is understood that in the static memory state of the memory cell one of the transistors 51, 52 is rendered nonconductive while the other is rendered conductive to form a memory loop to represent a binary state "1", while in the capacitive memory state of the cell the ON-OFF states of the transistors are reversed to store charges across the gap between the opposed electrodes of both transistors as a binary state "0".

Figure 5:
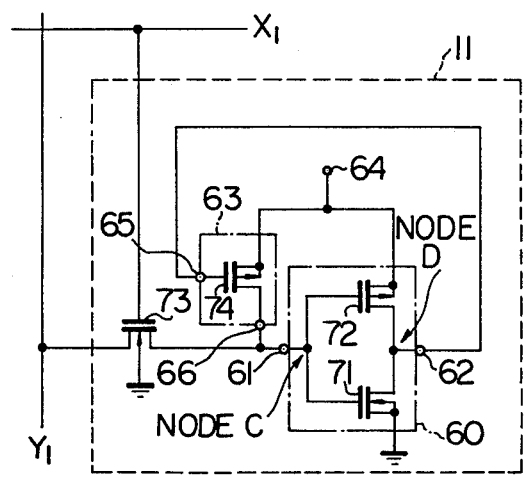
FIG. 5 is a circuit diagram of a second embodiment of the invention.

In accordance with a second aspect of the invention shown in FIG. 5, the memory cell 11 comprises a complementary MOS (CMOS) inverter 60 having input and output terminals 61 and 62, respectively and a MOS inverter 63 which is only responsive to a particular potential at the output of the CMOS inverter 60. The CMOS inverter 60 comprises a first or n-channel MOS transistor 71 and a second or p-channel MOS transistor 72 having their control electrodes connected together at node C to the input terminal 61 and their first electrodes connected together at node D to the output terminal 62 of the inverter 60. The second controlled electrodes of the first and second transistors 71 and 72 are connected to ground and to a supply terminal 64 at a potential of +V volts, respectively. The MOS inverter 63 has input and output terminals 65 and 66 respectively connected to the output and input terminals 62 and 61 of the CMOS inverter 60.

A third transistor or n-channel MOSFET 73 is provided. This transistor having the same function as the third transistor of the previous embodiments, the description thereof is omitted. The MOS inverter 63 is constituted by a fourth or p-channel MOSFET 74 having its control electrode connected through the inverter input terminal 65 to the node D of the CMOS inverter 60 through its output terminal 62 and its first controlled electrode connected to the node A of the CMOS inverter 60 and also to the second controlled electrode of the third transistor 73 through the output terminal 66 of the MOS inverter 63, the second controlled electrode of the fourth transistor being connected to the supply terminal 64. Because of the symmetrical structure of the inverter 60, it is capable of inverting the first data input potential (+V volts) to the second data input potential (0 volts) and vice versa. On the other hand, the inverter 63 is capable of only inverting the second data input potential to the first data input potential. Therefore, the inverter 60 can be considered as a symmetrical inverter while the inverter 63 can be considered as an asymmetrical inverter.

In operation, the memory cell 11 associated with the crosspoint $X_1$ and $Y_1$ is assumed to have been addressed to store a "1" therein. The ON state of the third transistor 73 upon the application of +V potential to the address bus $X_1$ conducts the +V potential at the address bus $Y_1$ to the node C which drives the first transistor 71 to the ON state which in turn clamps the node D at ground potential. Therefore, the state of the output terminal of the CMOS inverter 60 is a reverse of the state of the input terminal thereof. The ground potential at the output terminal 62 of inverter 60 drives the p-channel fourth transistor 74 of the MOS inverter 63 to the ON state which couples the +V potential from terminal 64 to the input terminal 61 of the CMOS inverter 60. Therefore, the output state of the CMOS inverter 60 is reversed by the MOS inverter 63 so that a memory loop is formed and a "1" is stored in the memory cell 11.

In writing a "0" on the addressed memory cell 11, the node C is brought to the ground potential in a manner as previously described which biases the control gate of the first transistor 71 reversely to turn it off while biasing the control gate of the second transistor 72 forwardly to turn it on. The turn-on of the second transistor 72 feeds the +V potential from terminal 64 to the output terminal of the inverter 60 and thence to the input terminal of the MOS inverter 63 to switch the fourth transistor 74 to the OFF state. The nodes C and D are respectively biased at 0 and +V volts and the memory cell 11 is in the capacitive memory state representing a "0" which conditions exists during the storage decay period determined by the storage capability of the first, second and fourth transistors 71, 72, 74.

Figure 6:
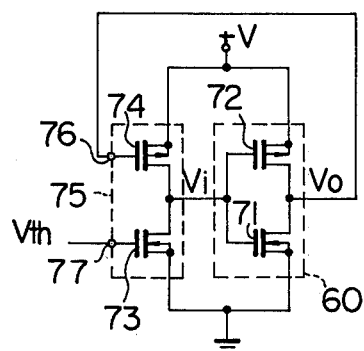
FIG. 6 is an equivalent circuit of the embodiment of FIG. 5 a refresh mode.
Figure 7:
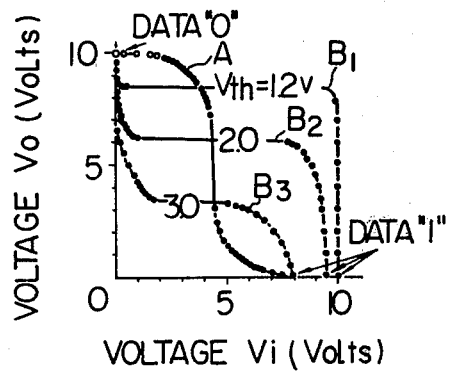
FIG. 7 is a graphical representation of the characteristics of the memory cells of FIG. 5.

Subsequent to the read/write operation, refreshment of "0" state memory cells follows in the same manner as previously described. During the refreshment interval, the memory cell 11 of FIG. 5 can be considered as having an equivalent circuit as shown in FIG. 6 in which transistors 73 and 74 constitute an inverter 75 of the type having two input terminals 76 and 77: the terminal 76 being connected to the output of the inverter 60 and the terminal 77 being connected to the X address bus which is biased at the potential of $+V_{th}$ which is slightly above the threshold voltage of the third transistor 73. Fig. 7 illustrates the characteristics of the inverters 60 and 75. Curve A shows the characteristic of the inverter 60 indicating clearly that two stable points exist at points designated by DATA "0" and "1" as a function of voltage $V_i$ at the input to the inverter 60. Curves $B_1$ to $B_3$ represent the characteristic of the inverter 75 indicating a sharp transition in amplitude as a function of voltage $V_o$ at the output of the inverter 60 for a particular voltage level at the control gate of the third transistor 73. From the standpoint of noise immunity, the gate voltage of transistor 73 is preferably set at a value equal to or slightly greater than the threshold voltage (2.0 volts) as indicated by curve $B_2$, since a slight variation of the output voltage $V_0$ may shift the stable point from DATA "0" to the other stable point DATA "1".

Figure 8:
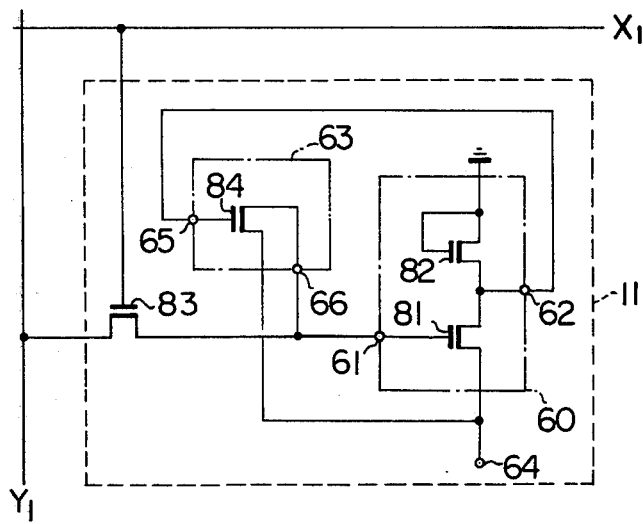
FIG. 8 is a modification of the second embodiment of FIG. 5.

The memory cell 11 constructed in accordance with the second aspect of the present invention can also be realized by the use of uni-channel MOS field-effect transistors as illustrated in FIG. 8. The inverter 60 comprises a first p-channel MOSFET 81 and a second p-channel MOSFET 82. The control electrode of the first transistor 81 is connected to the input terminal 61 of the inverter 60 and its first controlled electrode is connected to the output terminal 62 of the inverter 60 and also to a first controlled electrode of the second transistor 82. The second controlled electrode of the first transistor 81 is connected to the power supply terminal 64 at the potential of +V volts and the second controlled electrode of the second transistor 82 is connected to ground. A third transistor or p-channel MOSFET 83 is provided having the same function as the third transistor of the previous embodiments. The inverter 63 comprises a fourth transistor or p-channel MOSFET 84 having its control electrode connected to the input terminal 65 of the inverter 63 and its first controlled electrode connected to the output terminal 66. The second controlled electrode of the fourth transistor is connected to the voltage supply terminal 64.

In operation, a "1" is stored on the memory cell 11 which is assumed to have been addressed by application of a first data input potential +V volts on the address bus $Y_1$ and a first control potential or ground potential to the address bus $X_1$ in the same manner as referred to above to bias the input terminal 61 of the inverter 60 positively so that the first transistor 81 is switched off. The turn-off of transistor 81 applies ground potential through the conducting transistor 82 to the output terminal 62 and thence to the input of inverter 63 to turn on the fourth transistor 84. The +V potential from source 64 is applied through the now conducting transistor 84 to the input terminal 61 of the inverter 60. This condition represents the memory state "1".

A "0" is stored on the memory cell 11 by application of 0 volts on the address bus $Y_1$ through the conducting transistor 83 to the input terminal 61 of inverter 60. The first transistor 81 is switched on to raise the potential at the output terminal 62 of inverter 60 to +V volts which drives the fourth transistor 84 to the OFF state disconnecting the supply of +V potential to the input terminal 61. Charges are stored across the gap between the opposed electrodes of the first and fourth transistors 81 and 84 to represent the memory state "0".

In a modification of the embodiment of FIG. 3 shown in FIG. 9, an additional address bus $Y_1''$ is provided in addition to the address bus $Y_1'$ which constitutes with the bus $Y_1''$ the previously mentioned address bus $Y_1$. The memory cell 11 comprises the monostable memory device 20 including a first n-channel MOSFET 91 and a second n-channel MOSFET 92 so cross-coupled as in the embodiment of FIG. 3 that nodes A and B are provided at the junction between the control electrode and the first controlled electrode of the transistors 91 and 92 and the second electrodes of the first and second transistors are respectively connected to ground and a terminal 95 at a potential of $+V$ volts. To the nodes A and B are connected the first controlled electrode of third and fourth n-channel MOSFETs 93 and 94, respectively. The transistors 93 and 94 have their control electrodes connected to the address bus $X_1$ and their second controlled electrodes connected respectively to the Y address buses Y address buses $Y_1'$ and $Y_1''$. The Y decoder $13_1$ includes a circuit shown in broken-line rectangle 100 to provide opposite potentials to the respective $Y_1$ address buses. The circuit 100 includes a first n-channel MOSFET 101 and a second n-channel MOSFET 102 having their control electrodes connected together to the Y address bus $Y_1$ and their first controlled electrodes connected respectively to the address buses $Y_1'$ and $Y_1''$, and their second controlled electrodes connected respectively to a $+V$ potential source and ground. The circuit 100 further includes third and fourth p-channel MOSFETs 103 and 104 and having their control electrodes connected together to the Y address bus $Y_1$, their first controlled electrodes connected respectively to the address buses $Y_1'$ and $Y_1''$, and their second controlled electrodes connected to the ground and $+V$ potential, respectively.

In operation, the memory cell 11 associated with the address buses $X_1$, $Y_1'$ and $Y_1''$ is assumed to have been addressed. A "1" is stored on the addressed memory cell 11 by application of a $+V$ potential to the Y address bus $Y_1$ which drives both transistors 101 and 102 of circuit 100 into conduction to apply $+V$ and 0 volts, respectively, to the address buses $Y_1'$ and $Y_1''$. Simultaneously, the third and fourth transistors 93 and 94 of the memory cell 11 are switched on by application of a $+V$ potential to the $X_1$ bus so that the nodes A and B are biased at $+V$ and 0 volts, respectively. The first and second transistors 91 and 92 are then rendered conductive to apply potentials of 0 and $+V$ volts to the second controlled electrode of the second and first transistors 92 and 91, respectively, to thereby form a memory loop to represent a binary state "1".

A data "0" is stored on the memory cell 11 by application of 0 volts to the Y address bus $Y_1$ as in the previous manner. This drives the third and fourth transistors 103 and 104 of the circuit 100 to conduct to pass the opposite potentials to the respective address buses so that the first and second transistors 91 and 92 of the memory cell are switched off. The data "0" is stored capacitively across the gap between the opposed electrodes of the transistors 91 and 92. At intervals, the charges are refreshed by application 0 volt potential to the address bus $Y_1$ and a potential of $+V_{th}$ volts to the address bus $X_1$ as previously described to cause the third and fourth transistors 93 and 94 to provide a relatively high conductive path between the nodes A and B address buses $Y_1'$ and $Y_1''$, respectively. It is needless to say that the rest of the "0" state memory cells 11 within the memory 10 is refreshed at the same time.

The foregoing description shows only preferred embodiments of the present invention. Various modifications are apparent to those skilled in the art without departing from the scope of the present invention. For example, the p- and n-channel MOSFETs employed in the embodiments of FIGS. 3 and 5 can be replaced by bipolar transistors of opposite conductivity types. Therefore, the scope of the present invention is only limited by the appended claims, the embodiments shown and described being only illustrative, not respective.

What is claimed is:

1. A method of operating a binary memory cell in a random access memory array including a plurality of X and Y address lines, means for supplying control potentials to said X address lines and means for supplying data input potentials to said Y address lines, said cell including first and second transistors each having a control terminal and first and second controlled terminals which are cross-coupled so that the control terminal of the first transistor is connected to the first controlled terminal of the second transistor defining a first circuit node and the control terminal of the second transistor is connected to the first controlled terminal of the first transistor defining a second circuit node, comprising the steps of:

forward biasing at least one of said first and second transistors in response to a presence of a first control potential applied on an addressed X address line and a first data input potential applied on an addressed Y address line to respectively cause said first and second transistors to assume a first binary state to store a first binary datum statically across said first and second circuit nodes;

reverse biasing at least one of said first and second transistors in response to a presence of said first control potential on said addressed X address line and a second data input potential on said addressed Y address line to respectively cause said first and second transistors to assume a second binary state to store a second binary datum nonstatically across said first and second circuit nodes; and refreshing storage of data in said cell by simultaneously biasing all of said X address lines at the second control potential at periodic intervals and simultaneously therewith biasing all of said Y address lines at said second data input potential while (1) when said first and second transistors are in the first binary state providing a low impedance path between said addressed Y address line and said first circuit node in response to a presence of a second control potential applied on said addressed X address line and said second data input potential applied on said addressed Y address line and (2) when said first and second transistors are in the second binary state providing a higher impedance path between said addressed Y address line and said first circuit node in response to a presence of the second control potential on said addressed X address line and said second data input potential on said addressed Y address line.

2. A random access memory system including a plurality of X and Y address lines, means for biasing said addressed X address line at one of first and second control potentials and means for biasing said addresses Y address line at one of first and second data input potentials, comprising:

a plurality of memory cells each comprising: a pair of first and second transistors each having a control terminal and first and second controlled terminals which are cross-coupled so that the control terminal of the first transistor is connected to the first controlled terminal of the second transistor defining a first circuit node and the control terminal of the second transistor is connected to the first controlled terminal of the first transistor defining a second circuit node, and means for (1) forward biasing at least one of said first and second transistors in response to the presence of said first control potential and said first data input potential to respectively cause said first and second transistors to assume a first binary state to store a first binary datum statically across said first and second circuit nodes and (2) reverse biasing at least one of said first and second transistors in response to the presence of said first control potential and a second data input potential to respectively cause said first and second transistors to assume a second binary state to store a second binary datum nonstatically across said first and second circuit nodes;

said means for biasing transistors including means for providing a low impedance path between said Y address line and said first circuit node in response to the presence of said second control potential and said second data input potential when said transistors are in said second binary state and a higher impedance path between said Y address line and said first circuit node in response to the presence of said second control potential and said second data input potential when said transistors are in said first binary state; and means for simultaneously applying said second control potential to all of said X address lines at periodic intervals and simultaneously therewith applying said second data input potential to all of said Y address lines to refresh the stored second binary datum.

3. A binary memory cell in a random access memory array including a plurality of X and Y address lines, means for addressing said X and Y address lines, means for biasing an addressed one of said X address lines at a first control potential, means for biasing an addressed one of said Y address lines at one of first and second data input potentials, and means for simultaneously biasing all of said X address lines at a second control potential at periodic intervals and simultaneously therewith biasing all of said Y address lines at said second data input potential, comprising:

a pair of first and second transistors each having a control terminal and first and second controlled terminals which are cross-coupled so that the control terminal of the first transistor is connected to the first controlled terminal of the second transistor defining a first circuit node and the control terminal of the second transistor is connected to the first controlled terminal of the first transistor defining a second circuit node; and transistor biasing means for (1) forward biasing at least one of said first and second transistors in response to the presence of said first control potential and said first data input potential to respectively cause said first and second transistors to assume a first binary state to store a first binary datum statically across said first and second circuit nodes and (2) reverse biasing at least one of said first and second transistors in response to the presence of said first control potential and said second data input potential to respectively cause said first and second transistors to assume a second binary state to store a second binary datum nonstatically across said first and second circuit nodes, said transistor biasing means further including means for providing a (1) low impedance path between said Y address line and said first circuit node in response to the presence of said second control potential and said second data input potential when said transistors are in said second binary state to refresh the second binary state and a (2) higher impedance path between said Y address line and said first circuit node in response to the second control potential and said second data input potential when said transistors are in said first binary state.

4. A binary memory cell as claimed in claim 3, wherein said transistor biasing means comprises a second Y address line adapted to be biased at a potential opposite to the potential of the first-mentioned Y address line, a third transistor having a control terminal connected to said X-address line, a first controlled terminal connected to said first-mentioned Y address line and a second controlled terminal connected to said first circuit node, a fourth transistor having a control terminal and first and second controlled terminals which are respectively connected to the X address line, the second circuit node and the second Y address line, and wherein said first and second transistors are field-effect transistors of opposite conductivity types and have their second controlled terminals respectively connected to first and second terminals of a voltage source.

5. A binary memory cell as claimed in claim 3, wherein the conductivity type of said first transistor is opposite to the conductivity type of said second transistor, and wherein said transistor biasing means includes means for connecting the second controlled terminals of the first and second transistors respectively to first and second terminals of a voltage source and means for providing an impedance between said second circuit node and said first terminal of the voltage source.

6. A binary memory cell as claimed in claim 5, wherein said transistor biasing means comprises a third transistor of the same conductivity type as said first transistor and having a control terminal connected to said X address line, a first controlled terminal connected to said Y address line and a second controlled terminal connected to said first circuit node, and a fourth transistor of the same conductivity type as said second transistor and having a control terminal connected to said first circuit node, a first controlled terminal connected to said first terminal of the voltage source and a second controlled terminal connected to said second circuit node.

7. A binary memory cell as claimed in claim 6, wherein said first and second transistors are each formed of a first complementary metal-oxide semiconductor field-effect transistor, and said third and fourth transistors are each formed of a second complementary metal-oxide semiconductor field-effect transistor.

8. A binary memory cell as claimed in claim 3, wherein said first and second transistors are of the same conductivity type, and wherein said transistor biasing means includes means for connecting the second controlled terminals of the first and second transistors to a first terminal of a voltage source and means for providing an impedance between said second circuit node and a second terminal of said voltage source.

9. A binary memory cell as claimed in claim 8, wherein said transistor biasing means comprises a third transistor having a control terminal connected to said X address line, a first controlled terminal connected to said Y address line and a second controlled terminal connected to said first circuit node, and a fourth transistor having a control terminal and a first controlled terminal connected together to the second terminal of said voltage source and a second controlled terminal connected to said second circuit node.

10. A binary memory cell as claimed in claim 9, wherein each of said first, second, third and fourth transistors comprises a uni-channel metal-oxide semiconductor field-effect transistor.

11. A method of operating a random access memory including a plurality of X and Y address lines, means for applying control potentials selectively on said X address lines, means for applying data input potentials selectively on said Y address lines, and a plurality of memory cells, each cell comprising first and second transistors, each transistor having a control terminal and first and second controlled terminals which are cross coupled so that the control terminal at the first transistor is connected to the first controlled terminal of the second transistor defining a first circuit node and the control terminal of the second transistor is connected to the first controlled terminal of the first transistor defining a second circuit node, comprising the steps of:

forward biasing at least one of said first and second transistors corresponding to an addressed cell in response to a presence of a first control potential applied on an addressed X address line in the presence of a first data input potential applied on an addressed Y address line to respectively cause said first and second transistors to assume a first binary state to store a first binary datum statically across said first and second circuit nodes;

reverse biasing at least one of said first and second transistors corresponding to the addressed cell in response to the presence of the first control potential on the addressed X address line and a presence of a second data input potential on the addressed Y address line to respectively cause said first and second transistors to assume a second binary state to store a second binary datum nonstatically across said first and second circuit nodes; and refreshing storage of data in said cell by (1) when said transistors are in said second binary state providing a low impedance path between said addressed Y address line and said first circuit node in response to the presence of the second control potential on the addressed X address line and of said second data input potential on said addressed Y address line, and (2) when said transistors are in the first binary state providing a higher impedance path between said addressed Y address line and said first circuit node in response to a presence of the second control potential applied on the addressed X address line and of the second data input potential applied on the addressed Y address line.

12. The method of claim 11 wherein the step of refreshing includes the steps of simultaneously applying the second control potential to all of said X address lines at periodic intervals and simultaneously therewith applying the second data input potential to all of said Y address lines.

13. A random access memory system including a plurality of X and Y address lines, means for addressing said X and Y address lines, means for biasing an addressed X address line at one of first and second control potentials and means for biasing an addressed Y address line at one of first and second data input potentials, comprising:

a plurality of memory cells each comprising an asymmetrical inverter circuit having a characteristic of storage decay over a decay period and an input and an output terminal, a symmetrical inverter circuit having a characteristic of storage decay over a decay period and an input terminal connected to the output terminal of said asymmetrical inverter defining a first circuit node and an output terminal connected to the input terminal of said asymmetrical inverter circuit, and a transistor having a control terminal connected to the X address line, a first controlled terminal connected to the Y address line and a second controlled terminal connected to said first circuit node for providing a low impedance coupling between said Y address line and said first node to cause said inverter circuits to form a static storage circuit to store a first binary datum across said first and second circuit nodes in response to the presence of said first control potential and said first data input potential and to cause said inverter circuits to form a nonstatic storage circuit to store a second binary datum across said first and second circuit nodes in response to the presence of said first control potential and said second data input potential, and for providing a relatively low impedance coupling between said Y address line and said first circuit node in response to the presence of a second control potential and said second data input potential when said nonstatic storage circuit is formed and a relatively higher impedance coupling between said Y address line and said first circuit node in response to the presence of said second control potential and said second data input potential when said static storage circuit is formed; and means for simultaneously applying said second control potential to all of said X address lines within said decay period alternately with the addressing of said X and Y lines and simultaneously therewith applying said second data input potential to all of said Y address lines to refresh the stored second binary data.

14. A binary memory cell in a random access memory array including a plurality of X and Y address lines, means for addressing said X and Y address lines, means for biasing an addressed one of said X address lines at a first control potential, means for biasing an addressed one of said Y address lines at one of first and second data input potentials, and means for simultaneously biasing all of said X address lines at a second control potential at periodic intervals and simultaneously therewith biasing all of said Y address lines at said second data input potential, comprising:

an asymmetrical inverter circuit having a characteristic of storage decay over a decay period and an input and an output terminal;

a symmetrical inverter circuit having a characteristic of storage decay over a decay period and an input terminal connected to the output terminal of said asymmetrical inverter circuit defining a first circuit node and an output terminal connected to the input terminal of said asymmetrical inverter circuit; and a transistor having a control terminal connected to the X address line, a first controlled terminal connected to the Y address line and a second controlled terminal connected to said first circuit node for providing a low impedance coupling between said Y address line and said first node to cause said inverter circuits to form a static storage circuit to store a first binary datum across said first and second circuit nodes in response to the presence of said first control potential and said first data input potential, and to cause said inverter circuits to form a nonstatic storage circuit to store a second binary datum across said first and second circuit nodes in response to the presence of said first control potential and said second data input potential, and for providing (1) a relatively low impedance coupling between said Y address line and said first circuit node in response to the presence of said second control potential and said second data input potential when said nonstatic storage circuit is formed to refresh said second binary data and (2) a relatively higher impedance coupling between said Y address line and said first circuit node in response to the presence of said second control potential and said second data input potential when said static storage circuit is formed.

15. A binary memory cell as claimed in claim 14, wherein said resistance means is formed by a third transistor having a control terminal and first and second controlled terminals, wherein the control terminal and the first controlled terminal of the third transistor are connected together to a first terminal of a source of voltage, and the second controlled terminal of the third transistor is connected to the second controlled terminal of the first-mentioned transistor.

16. A binary memory cell as claimed in claim 15, wherein said asymmetrical inverter circuit comprises a fourth transistor having a control terminal and first and second controlled terminals which are respectively connected to the output and input terminals of the symmetrical inverter circuit and a second terminal of said source of voltage.

17. A binary memory cell as claimed in claim 16, wherein each of said first and fourth transistors comprises a uni-channel MOS field-effect transistor.

18. A binary memory cell as claimed in claim 14, wherein said symmetrical inverter circuit comprises resistance means and a second transistor having a control terminal and first and second controlled terminals which are respectively connected to the input and output terminals of the symmetrical inverter circuit and to a first terminal of a source of voltage, said resistance means being connected between the first controlled terminal of said second transistor and a second terminal of said source of voltage.

19. A binary memory cell as claimed in claim 18, wherein said resistance means is formed by a third transistor having a control terminal and first and second controlled terminals, wherein the control terminal and the first controlled terminal of the third transistor are connected respectively to the control terminal and the first controlled terminal of the second transistor, and the second controlled terminal of the third transistor is connected to the second terminal of said voltage source.

20. A binary memory cell as claimed in claim 19, wherein said first and second transistors are formed by a complementary MOS field-effect transistor.

21. A binary memory cell as claimed in claim 20, wherein each of said second and third transistors comprises a uni-channel MOS field-effect transistor.

22. A binary memory cell as claimed in claim 19, wherein said asymmetrical inverter circuit comprises a fourth transistor having a control terminal and first and second controlled terminals which are respectively connected to the output and input terminals of the symmetrical inverter circuit and to a first terminal of a source of voltage.

23. A binary memory cell as claimed in claim 22, wherein the first-mentioned transistor and said fourth transistor are each formed by a complementary MOS field-effect transistor.

* * * * *